(12) United States Patent
Namiki et al.

(10) Patent No.: US 6,286,452 B1
(45) Date of Patent: Sep. 11, 2001

(54) SPUTTERING APPARATUS

(75) Inventors: Shigeru Namiki, Kadoma; Hidetoshi Kawa, Ibaraki, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/450,176

(22) Filed: Nov. 29, 1999

(30) Foreign Application Priority Data

Dec. 2, 1998 (JP) .................................................. 10-342811

(51) Int. Cl.⁷ .................................................. C23C 16/509
(52) U.S. Cl. .................................. 118/723 E; 204/298.01; 204/192.12; 118/723 R; 118/719
(58) Field of Search ........................ 204/192.38, 192.12, 204/192 EC, 298.09, 192.13; 118/719, 723 R, 629, 666, 715, 718, 723 E, 723 I, 723 MR, 723 MW; 156/345, 643; 414/225, 222

(56) References Cited

U.S. PATENT DOCUMENTS

| | | | |
|---|---|---|---|
| 4,410,407 | * 10/1983 | Macaulay | 204/192 EC |
| 4,632,719 | * 12/1986 | Chow et al. | 156/345 |
| 4,718,975 | * 1/1988 | Bowling et al. | 156/643 |
| 4,836,733 | * 6/1989 | Hertel et al. | 414/225 |
| 4,909,695 | * 3/1990 | Hurwitt et al. | 414/217 |
| 5,130,005 | * 7/1992 | Hurwitt et al. | 204/192.12 |
| 5,215,640 | * 6/1993 | Buhl et al. | 204/192.38 |
| 5,252,194 | * 10/1993 | Demaray et al. | 204/298.2 |
| 5,267,607 | * 12/1993 | Wada | 165/80.1 |
| 5,284,561 | * 2/1994 | Shinneman et al. | 204/192.13 |
| 5,387,326 | * 2/1995 | Buhl et al. | 204/192.38 |
| 5,417,798 | * 5/1995 | Nishibayashi et al. | 216/67 |
| 5,427,670 | * 6/1995 | Baggerman et al. | 204/298.09 |
| 5,540,821 | * 7/1996 | Tepman | 204/192.13 |
| 5,556,500 | * 9/1996 | Hasegawa et al. | 156/345 |
| 5,626,677 | * 5/1997 | Shirahata | 118/719 |
| 5,772,770 | * 6/1998 | Suda et al. | 118/719 |
| 5,863,170 | * 1/1999 | Bottnott et al. | 414/222 |
| 5,904,778 | * 5/1999 | Lu et al. | 118/723 R |
| 5,972,116 | * 10/1999 | Takagi | 118/719 |

FOREIGN PATENT DOCUMENTS 7-102366   4/1995   (JP) .

* cited by examiner

*Primary Examiner*—Gregory Mills
*Assistant Examiner*—Rudy Zervigon
(74) *Attorney, Agent, or Firm*—Price and Gess

(57) ABSTRACT

The chamber 1 of the spattering apparatus has a gas introduction port 2 provided at one side in a direction orthogonal to the opening/closing direction of a door 11 of chamber 1, and a vacuum evacuation port 3 provided on the other side of chamber. A substrate holder 4 is fixed on door 11, and a cathode 31 is arranged on a wall face facing door 11 of chamber 1. A shield 41 is arranged in close proximity to and so as to cover the peripheral part of substrate holder 4. A hole 42 is formed in shield 41 in a location facing vacuum evacuation port 3, whereby rapid vacuum evacuation can be achieved even though shield 41 is arranged in a condition close to sealing with respect to the peripheral part of substrate holder 4.

12 Claims, 5 Drawing Sheets

SPUTTERING APPARATUS

BACKGROUND OF THE INVENTION

1. Technical Field of the Invention

The present invention relates to a sputtering apparatus whereby film deposition is performed in vacuum on to a semiconductor wafer or disk such as a CD or DVD.

2. Description of Prior Art

An example of a prior art sputtering apparatus disclosed in Japanese Laid-Open Patent Application No. 7-102366 will be described with reference to FIG. 7. In FIG. 7, a substrate 60 is mounted on a substrate holder 63 which is arranged fixed to a door 62 of chamber 61, and a cathode 64 is arranged so as to face substrate holder 63. A shutter plate 65 is arranged in a retractable manner between substrate holder 63 and cathode 64. A sputtering power source 66 applies voltage to cathode 64. A vacuum evacuation port 67 is provided on one side of chamber 61 and a gas introduction port 68 is provided on the other side for introducing sputtering gas. An earth shield 69 is arranged around cathode 64, and a shield 70 is provided such as to surround the peripheral part of substrate holder 63.

For film deposition, door 62 is opened and a substrate 60 is held on substrate holder 63; door 62 is then closed and vacuum evacuation is performed from vacuum evacuation port 67 and sputtering gas is introduced from gas introduction port 68 whilst maintaining the interior of chamber 61 at a predetermined vacuum pressure; a sputtered film is formed on substrate 60 by applying negative charge to cathode 64 by means of sputtering power source 66. After this, the interior of chamber 61 is returned to atmospheric pressure, door 62 is opened, substrate 60 on which the film has been formed is removed, and a substrate on to which film is to be deposited is supplied to substrate holder 63.

Such sputtering apparatuses are used on account of their low equipment cost, simplicity and suitability for batch production.

However, in such sputtering apparatuses, since vacuum evacuation and opening to the atmosphere are repeated every time film deposition is performed, the processing efficiency shows considerable dependence on the time required for vacuum evacuation to the background vacuum pressure for sputtering. However, with the sputtering apparatus of conventional construction, time is required for the vacuum evacuation since, in particular, vacuum evacuation of the interior space is obstructed by shield 70 which is arranged surrounding the peripheral part of substrate holder 63 in what is close to a sealed condition; there was therefore the problem that processing efficiency was adversely affected.

A further problem was that in the conventional sputtering apparatus consideration was not given to the automation of mounting and removal of the substrate and it was not possible to improve production efficiency.

SUMMARY OF THE INVENTION

In view of the above problems of the prior art, an object of the present invention is to provide a sputtering apparatus wherein the time required for vacuum evacuation can be reduced and wherein the efficiency of the film formation process can be raised by automating the mounting and removal of the substrate.

In a sputtering apparatus according to the present invention, a gas introduction port for introducing a sputtering gas into the chamber is provided on one side in a direction orthogonal to the direction of opening and closing of the door of the chamber, while a vacuum evacuation port is provided on the other side of the chamber. A substrate holder is provided on the door of the chamber, and a cathode is provided on a wall face of the chamber facing the door of the chamber. A shield is arranged in close proximity to and so as to cover the peripheral part of the substrate holder, and this shield has a hole formed in a location facing the vacuum evacuation port.

Thereby, the shield in a condition close to sealing the peripheral part of the substrate holder performs its function satisfactorily, and yet, even though the volume of the interior space is large, rapid vacuum evacuation can be effected due to the formation of the hole in a location of the shield facing the vacuum evacuation port. Consequently, even though the capacity of the vacuum pump is the same, the time required for the vacuum evacuation can be shortened, thereby improving processing efficiency. Also, since the hole of the shield is formed on the opposite side to the gas introduction port i.e. on the side facing the vacuum evacuation port, the formation of the hole involves little risk of film deposition on the substrate holder, so there is no possibility of the function of the shield being impaired.

If the cathode is arranged offset to the gas introduction port side with respect to the substrate holder, and a rotary mechanism is provided on the substrate holder, film deposition of uniform thickness on to the substrate can be achieved by introducing gas from one side of the chamber and performing vacuum evacuation from the other side, and the risk of film deposition on the substrate holder through the hole can be reduced even further.

In a sputtering apparatus according to another aspect of the present invention, a positional location mechanism is provided for effecting positional location in a condition with the door open. And further, a substrate detection sensor that detects conveyance of the substrate on to the substrate holder and a substrate holding sensor that detects holding of the substrate on the substrate holder is provided.

Thereby, the presence of a substrate supplied to the substrate holder on the door located in position can be detected, and also, the holding of the substrate can be detected. By combination with means for automatic supply and automatic removal of the substrate, an automatic production line with other apparatuses such as a cleaner or coater can be achieved.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF THE PREFERRED EMBODIMENTS

An embodiment of a sputtering apparatus according to the present invention is described below with reference to FIG. 1 to FIG. 6.

Figure 1:
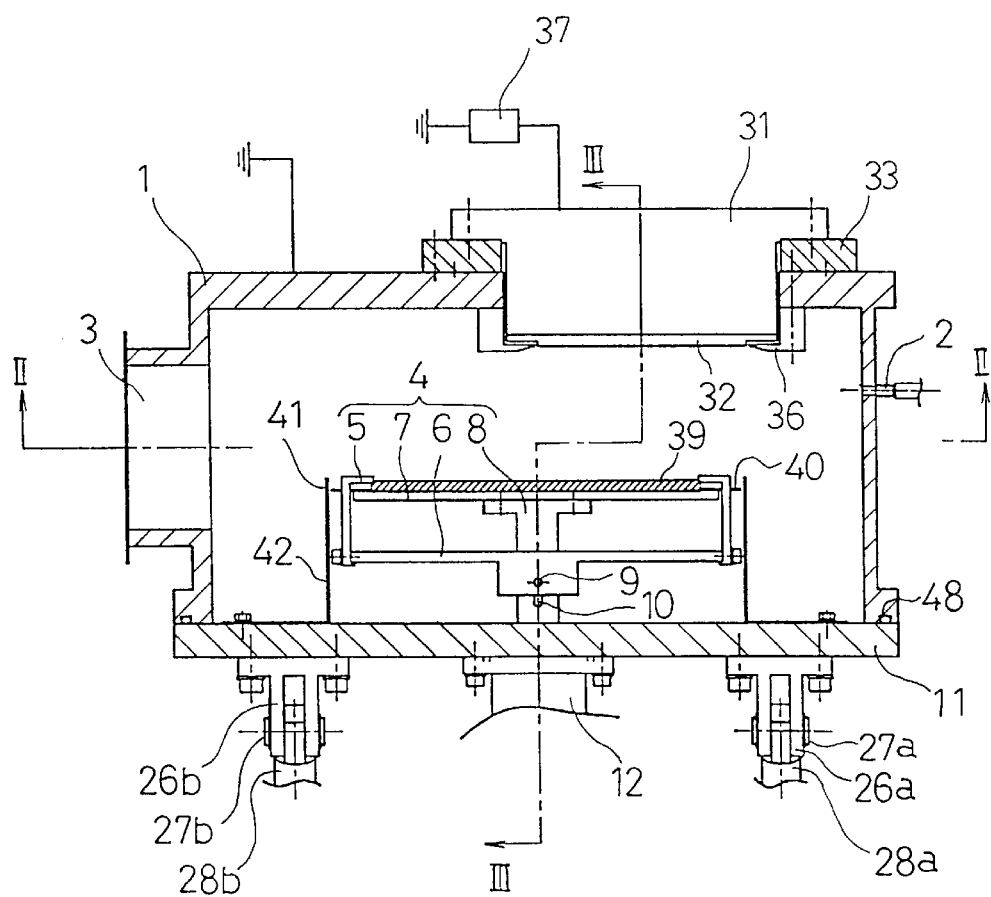
FIG. 1 is an overall axial cross-sectional view of an embodiment of a sputtering apparatus according to the present invention.
Figure 2:
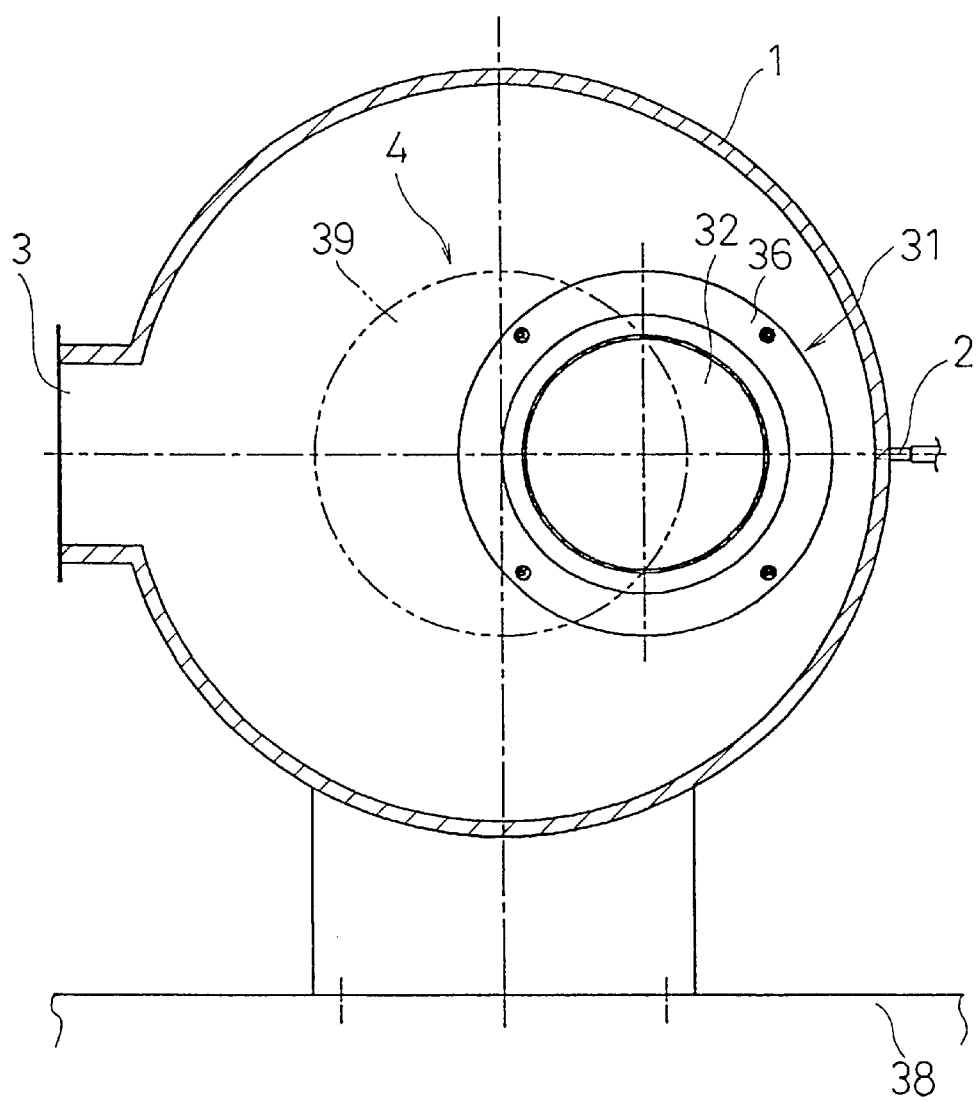
FIG. 2 is a cross-sectional view along the direction of the arrows II—II of FIG. 1.

In FIG. 1 and FIG. 2, a chamber 1 is opened and closed by a door 11 that can be moved in the vertical direction to effect opening and closure of chamber 1. A gas introduction port 2 is arranged on one side of chamber 1 in the direction orthogonal to the direction of opening/closure of door 11 and a vacuum evacuation port 3 is arranged on the other side of chamber 1. A substrate holder 4 is arranged on door 11. In the condition with door 11 closed, chamber 1 is vacuum-sealed by means of sealing member 48. Cathode 31 is arranged on the wall surface facing door 11 of chamber 1. As can be seen from FIG. 2, gas introduction port 2, cathode 31, substrate holder 4 and vacuum evacuation port 3 are arranged practically on a straight line and cathode 31 is arranged in a position offset towards the gas introduction port 2 with respect to the center of substrate holder 4. Provided the position of arrangement of cathode 31 is within a range of about 15° with respect to this straight line, it appears there is little effect on the film thickness distribution in actual film deposition.

Substrate holder 4 comprises: a plate 7 that directly receives substrate 39, a chuck 5 that holds substrate 39 in co-operation with plate 7, a rotary shaft 8 with plate 7 fixed at one end thereof, a sliding plate 6 that is slidably fitted on to rotary shaft 8 with chuck 5 mounted and fixed at its periphery, and a link pin 9 that couples sliding plate 6 with rotary shaft 8 in slidable fashion and such that they can rotate together. Substrate holder 4 is mounted on door 11 supported by holder 12.

The peripheral part of substrate holder 4 is surrounded by a cylindrical shield 41 that is fixed to door 11. A shield 40 consisting of a separate annular plate is mounted on plate 7 in respect of the cathode side. Shield 41 surrounds the peripheral part of shield 40 with a very slight gap, so that film deposition on to the internal structure is prevented by these shields 41 and 40. Also, as shown in FIG. 3, a hole 42 is formed in shield 41 in a portion facing vacuum evacuation port 3.

Cathode 31 comprises target 32, earth shield 36, insulator 33, and sputtering power source 37, and is mounted in chamber 1 being vacuum-sealed by sealing members 34, 35.

Figure 3:
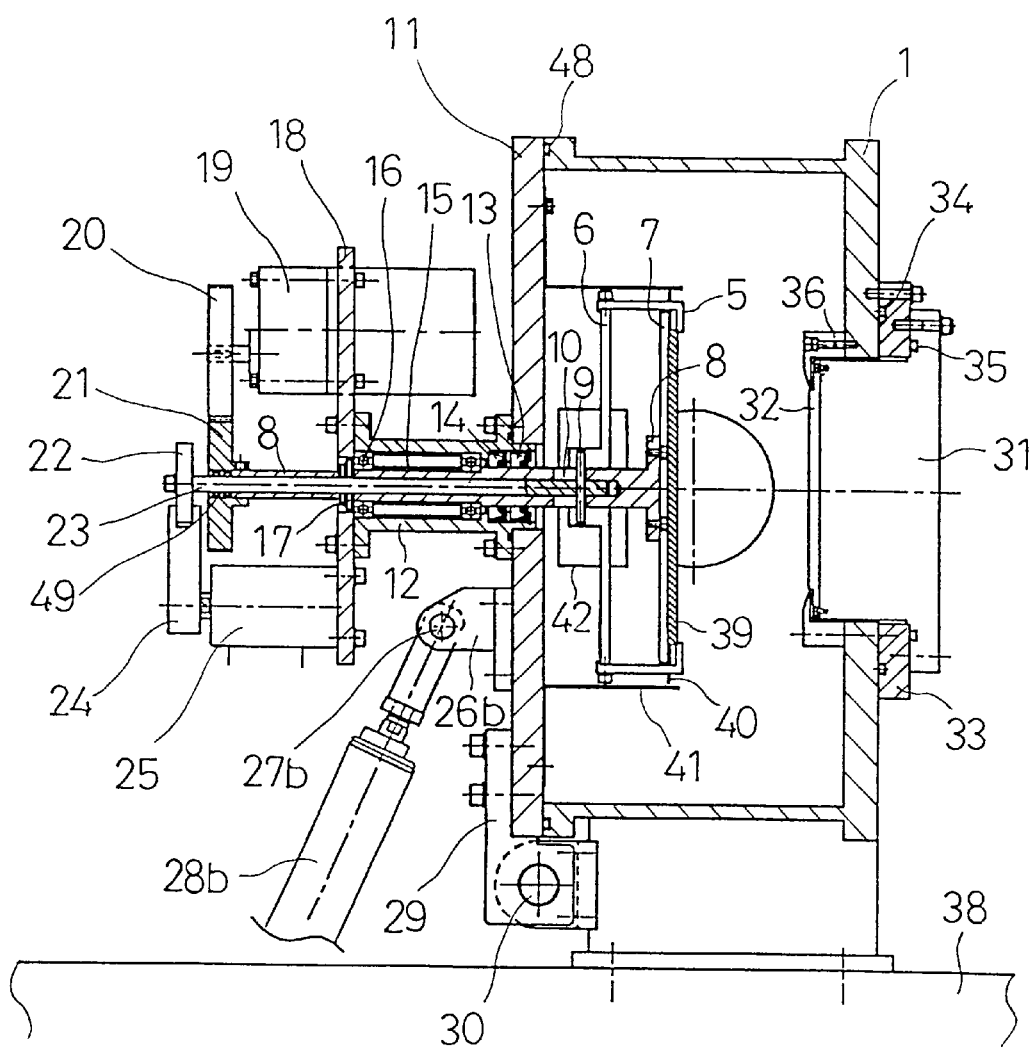
FIG. 3 is a cross-sectional view along the direction of the arrows III—III of FIG. 1.
Figure 5:
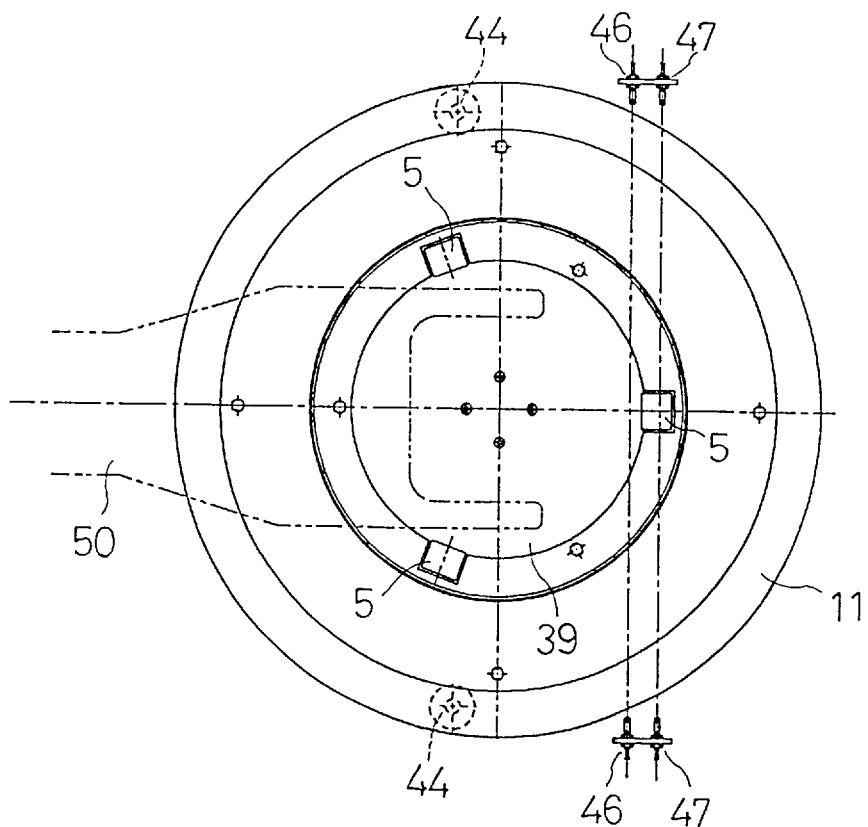
FIG. 5 is a plan view of FIG. 4.

As shown in FIG. 3 and FIG. 5, a bracket 29 that is fixed to the bottom end of door 11 is supported such that it is freely rotatable about a pin 30 which is arranged at the bottom of the front face of chamber 1. Brackets 26a and 26b that are fixed on both sides of door 11 are respectively linked to one end of cylinders 28a, 28b through pins 27a, 27b, the other ends of cylinders 28a, 28b being mounted on a base 38. The construction is therefore such that door 11 is automatically opened and closed by extension/retraction operation of cylinders 28a, 28b.

FIG. 3 shows details of the rotary and sliding mechanism of substrate holder 4. On holder 12 there is a freely rotatably mounted a rotary shaft 8 comprising a hollow shaft closed at one end through a nut 17 and collar 15, bearing 16 and vacuum seals 13 and 14. Pin 9 is fixed to one end of a shaft 23 inserted into the hollow part of this rotary shaft 8 and is freely slidably engaged with a slot 10 formed in one end of rotary shaft 8. A vacuum seal 49 is provided between rotary shaft 8 and shaft 23.

A gear 21 is fixed at the other end of rotary shaft 8 and rotation of motor 19 is transmitted thereto through a gear 20. A rotary plate 22 is also fixed to the other end of shaft 23, and the periphery of rotary plate 22 is engaged with a receiving member 24 in such a manner that it is free for relative rotation. Receiving member 24 is reciprocated by means of cylinder 25 and this movement is transmitted to sliding plate 6 through shaft 23 and pin 9, thereby effecting holding and removal operation of substrate 39 by opening/closure operation of chuck 5. Motor 19 and cylinder 25 are fixed to mounting plate 18 that is fixed to holder 12.

Figure 4:
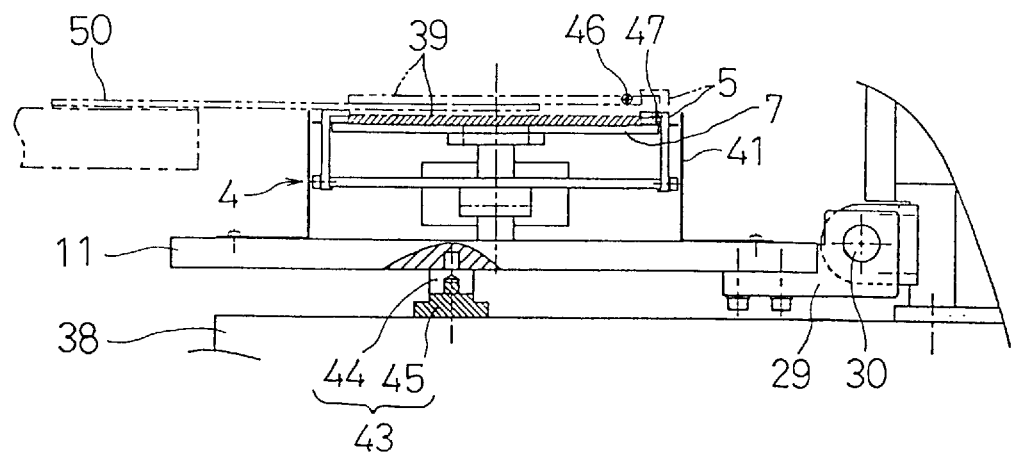
FIG. 4 is a side view of a door in this embodiment in the condition with the door open.

FIG. 4 and FIG. 5 show a positional location mechanism 43 for locating the door 11 in an open condition, which comprises a pin receiving part 44 that is fixed to door 11 and a pin 45 that is fixed to base 38. As shown in FIG. 5, there are a pair of positional location mechanisms 43 respectively arranged at two positions, door 11 being located in the plane by means of these.

When door 11 is thus located in position a substrate detection sensor 46 detects substrate 39 when a substrate 39 is correctly supplied by a robot 50. Furthermore, a substrate holding sensor 47 is provided in order to detect chuck 5 when substrate 39 is correctly held by chuck 5. It should be noted that a sensor that detects the end (not shown) of cylinder 25 could be employed for substrate holding sensor 47. Thanks to this construction, handing over of substrates 39 by robot 50 can be performed in a reliable manner, making it possible to employ an automatic production line.

With the above construction, when door 11 is opened in a condition with positional location effected by positional location mechanism 43, a substrate 39 is supplied on to substrate holder 4 by robot 50, and this substrate 39 is then detected by substrate detection sensor 46. When robot 50 retracts and substrate 39 is held by chuck 5 on plate 7, this condition is detected by substrate holding sensor 47, upon which door 11 is closed, whereby mounting of the substrate is terminated. Automation of substrate mounting by robot 50 can easily be implemented thanks to the provision of positional location mechanism 43, substrate detection sensor 46, and substrate holding sensor 47 as described above.

Figure 6:
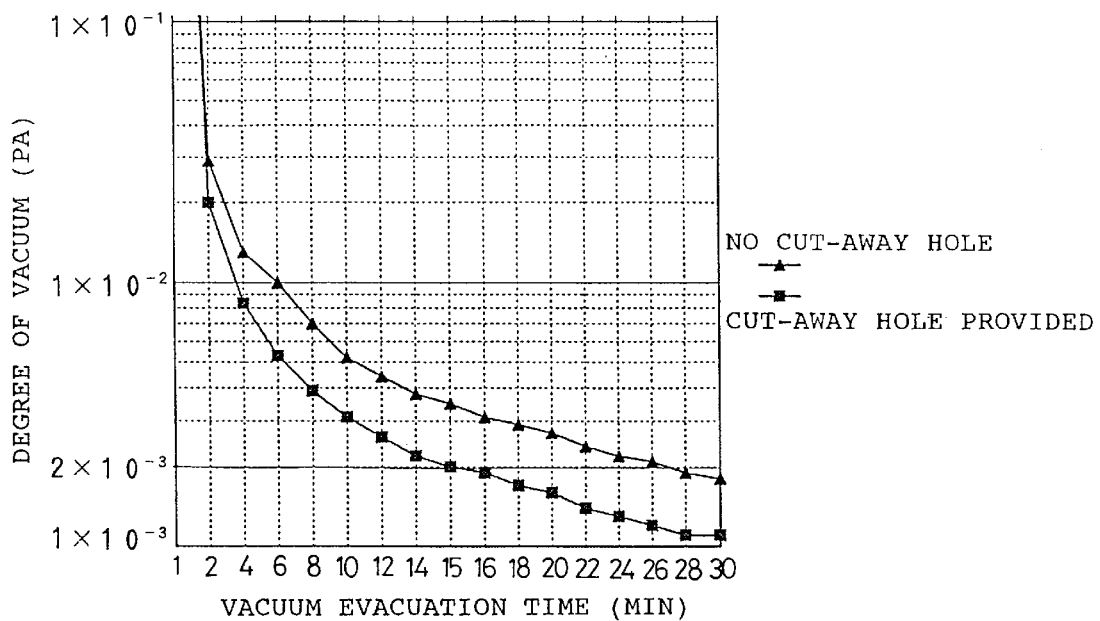
FIG. 6 is a graph showing the change of degree of vacuum within the chamber with time from the start of vacuum evacuation.
Figure 7:
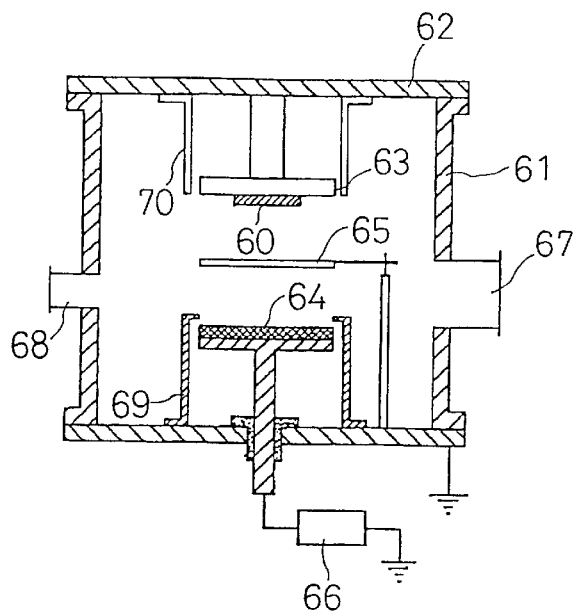
FIG. 7 is an overall axial cross-sectional view of a sputtering apparatus constituting a prior art example.

After this, the interior of chamber 1 is evacuated to vacuum. Evacuation to vacuum is rapidly effected, since shield 41 is arranged in a condition that is close to sealing with respect to the peripheral part of substrate holder 4 and, since, even though the volume of the internal space is large, hole 42 is formed in shield 41 at a location facing this vacuum evacuation port 3. FIG. 6 shows the change in degree of vacuum within chamber 1 in the case where a hole 42 is provided in shield 41 and in the case where no such hole is provided. As can be seen from FIG. 6, if the background degree of vacuum for sputtering is taken to be $2\times10^{-3}$ Pa, whereas, when no hole 42 is provided, about 27 minutes is required to achieve this degree of vacuum, if a hole 42 is formed, the required time is about 15 minutes i.e. it can be reduced by about 12 minutes.

Thus, for the same vacuum pump capacity, the formation of hole 42 enables the time required for vacuum evacuation to be shortened, thereby enabling processing efficiency to be raised. Also, since hole 42 is formed on the opposite side to that of gas introduction port 2 facing vacuum evacuation port 3, the formation of hole 42 involves little risk of film deposition on substrate holder 4, so there is no possibility of the function of shield 41 being impaired.

Next, while maintaining the predetermined degree of vacuum within chamber 1 by vacuum evacuation from vacuum evacuation port 3, sputtering gas is introduced from gas introduction port 2 and a sputtered film is generated on the substrate 39 by application of negative charge by sputtering power source 37 to cathode 31 whilst rotating substrate 39 that is mounted and held on plate 7 by motor 19 through rotary shaft 8. Since in this process cathode 31 is arranged offset towards gas introduction port 2 in regard to substrate holder 4, even though gas is introduced from one side of chamber 1 and vacuum evacuation is effected from the other side, the film thickness on substrate 39 can still be made uniform. Moreover, the risk of film deposition on the substrate holder through the hole can be reduced even further.

When film deposition on to substrate 39 has been completed, the interior of chamber 1 is returned to atmospheric pressure, door 11 is opened, and the substrate 39 on which the film has been deposited is removed and, as described above, the next substrate on to which a film is to be deposited is supplied on to substrate holder 4, these operations being repeated.

It should be noted that the shield that prevents film deposition on to the inside surface of chamber 1 is not shown because to do so would complicate the drawings. In fact, by providing such a shield and also cleaning this shield, excess deposition of film in chamber 1 itself can be prevented; this is advantageous in regard to the cleansing operation and improvement of substrate film quality.

With a sputtering apparatus according to the present invention, even though a shield is arranged as described above in close to a sealing condition in regard to the peripheral part of the substrate holder so as to provide its function, since a hole is formed in a location of the shield facing the vacuum evacuation port, rapid vacuum evacuation can be achieved. Consequently, for the same vacuum pump capacity, the time required for a vacuum evacuation can be shortened, thereby enabling processing efficiency to be raised. Also, since this hole is formed on the side facing the vacuum evacuation port, on the opposite side of the shield to the gas introduction port, this forming of a hole carries little risk of film deposition on the substrate holder and there is no possibility of impairing the function of the shield.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A sputtering apparatus comprising:

a chamber having a door;

a gas introduction port for introducing a gas into the chamber to enable deposition of a material, the gas introduction port is provided on one side in a direction orthogonal to the direction of opening and closing of the door of the chamber;

a vacuum evacuation port provided on an opposite side from the gas introduction port of the chamber;

a substrate holder provided on the door of the chamber with a rotary mechanism;

a cathode provided on a wall face of the chamber facing the door of the chamber and arranged offset to the gas introduction port with respect to the substrate holder;

a solid shield arranged in close proximity to and covering the peripheral part of the substrate holder to prevent deposition of material on the substrate holder, said shield having a hole formed beneath the peripheral part in a location facing the vacuum evacuation port whereby vacuum evacuation time of the substrate holder is lowered.

2. A sputtering apparatus comprising:

a chamber having a door;

a gas introduction port for introducing a gas into the chamber;

a vacuum evacuation port;

a substrate holder provided on the door of the chamber for receiving a substrate;

a cathode provided on a wall face of the chamber facing the substrate holder when the door of the chamber is closed, wherein the cathode is arranged offset from an axial alignment with the substrate holder in a direction towards the gas introduction port;

a positional location mechanism for effecting positional location of the substrate holder in a condition with the door open;

a substrate detection sensor that detects conveyance of the substrate on to the substrate holder; and a substrate holding sensor that detects holding of the substrate on the substrate holder.

3. A sputtering apparatus comprising:

a chamber;

a gas introduction port for introducing a gas into the chamber provided on one side of the chamber;

a vacuum evacuation port provided on an opposite side from the gas introduction port of the chamber to enable an evacuation of the chamber;

a substrate holder unit provided within the chamber between the gas introduction port and the vacuum evacuation port;

a cathode provided above the substrate holder unit, wherein the cathode is arranged offset from an axial alignment with the substrate holder unit in a direction towards the gas introduction port; and a solid shield member arranged in close proximity to and extending about and below a peripheral portion of the substrate holder unit, shield member having a hole formed on a side location facing the vacuum evacuation port of sufficient size to enable vacuum evacuation of the substrate holder unit.

4. The sputtering apparatus according to claim 3 wherein the solid shield member has a cylindrical configuration.

5. The sputtering apparatus according to claim 4 wherein the substrate holder unit rotates a substrate.

6. The sputtering apparatus according to claim 3 further including a door member forming a portion of the chamber, the door member mounting on a first interior side the solid shield member and the substrate holder unit and being movable for permitting a substrate to be loaded on the substrate holder unit when the door is opened.

7. The sputtering apparatus according to claim 6 wherein the door is pivotally connected along one side to the chamber.

8. The sputtering apparatus according to claim 6 wherein a positional location mechanism determines an open position of the door for loading a substrate.

9. The sputtering apparatus according to claim 6 further including a motor mounted on a second exterior side of the door and operatively mounted for rotatably driving the substrate holder unit.

10. A deposition apparatus for coating a substrate comprising:

a sealable chamber having a movable door member forming a portion of a wall of the chamber;

a cathode mounted in the chamber;

a gas introduction port for introducing a deposition gas into the chamber;

a vacuum evacuation port;

a substrate holder unit mounted on an interior surface of the door member, wherein the cathode is arranged offset from an axial alignment with the substrate holder unit in a direction towards the gas introduction port;

a motor unit operatively mounted on an exterior surface of the door member, the substrate holder unit and the motor unit are integrally movable with the door and the motor unit drives the substrate holder unit to rotate a substrate during a deposition mode of operation when the door forms a portion of the chamber;

a positional location mechanism for effecting positional location in a condition with the door member open;

a substrate detection sensor that detects conveyance of the substrate on to the substrate holder unit; and a substrate holding sensor that detects holding of the substrate on the substrate holder unit whereby the door member can be opened to permit a discharge of a coated substrate and the charging of a new substrate to be coated.

11. The deposition apparatus according to claim 10 further including a shield member with an opening facing the vacuum evacuation port arranged in close proximity to and extending about a peripheral portion of the substrate holder unit.

12. The deposition apparatus according to claim 11 wherein the shield member has a cylindrical configuration.

* * * * *